United States Patent
Fukuda

[11] Patent Number: 5,831,483
[45] Date of Patent: Nov. 3, 1998

[54] PLL FREQUENCY SYNTHESIZER HAVING CIRCUIT FOR CONTROLLING GAIN OF CHARGE PUMP CIRCUIT

[75] Inventor: Shinri Fukuda, Tokyo, Japan

[73] Assignee: NEC Corporation, Tokyo, Japan

[21] Appl. No.: 791,029

[22] Filed: Jan. 29, 1997

[30] Foreign Application Priority Data

Jan. 30, 1996 [JP] Japan ................................. 8-014075

[51] Int. Cl.$^6$ ................................................ H03L 7/00
[52] U.S. Cl. .................................. 331/17; 331/25
[58] Field of Search ..................... 331/17, 25; 327/157

[56] References Cited

U.S. PATENT DOCUMENTS

| | | | |
|---|---|---|---|
| 4,156,855 | 5/1979 | Crowley | 331/1 A |
| 4,745,372 | 5/1988 | Miwa | 331/8 |
| 5,126,692 | 6/1992 | Shearer et al. | 331/8 |
| 5,276,408 | 1/1994 | Norimatsu | 331/8 |
| 5,334,951 | 8/1994 | Hogeboom | 331/1 A |
| 5,475,326 | 12/1995 | Masuda | 327/157 |

FOREIGN PATENT DOCUMENTS

| | | |
|---|---|---|
| 0 528 651 A2 | 2/1993 | European Pat. Off. . |
| 4192625 | 7/1992 | Japan . |
| WO 95/10880 | 4/1995 | WIPO . |

Primary Examiner—David Nelms
Assistant Examiner—Hoai V. Ho
Attorney, Agent, or Firm—Whitham, Curtis & Whitham

[57] ABSTRACT

A PLL frequency synthesizer has a detecting circuit 7 integrating a difference of an up signal and a down signal down, and outputting a control signal Vg according to the difference, and a charge circuit 5 receiving the control signal Vg, up signal and down signal, charging an output node by a first current ability when the control signal Vg is at a high level and the up signal and the down signal are at high level and at low level, respectively, discharging the output node by first current ability when the control signal Vg is at high level and the up signal and the down signal are at low level and at high level, respectively, charging the output node by second current ability lower than first current ability when the control signal Vg is at high level and the up signal and the down signal are at high level and at low level, respectively, and discharging the output node by second current ability when the control signal is at low level and the up signal and the down signal are at low level and high level.

4 Claims, 4 Drawing Sheets

PRIOR ART

PRIOR ART

PLL FREQUENCY SYNTHESIZER HAVING CIRCUIT FOR CONTROLLING GAIN OF CHARGE PUMP CIRCUIT

BACKGROUND OF THE INVENTION

1. Field of the Invention

This invention relates to a phase locked loop (PLL) frequency synthesizer and, more particularly, to a PLL frequency synthesizer having a circuit for controlling a gain of charge pump circuit.

2. Description of the Related Art

Recently, PLL synthesizer circuit has used to keep a frequency at constant value.

With a conventional PLL synthesizer circuit, there is known a technique for changing frequency at high speed and stabilizing circuit action after changing the frequency, which raises loop gain when changing frequency to shorten the pull-in time (lock-up time) and drops the loop gain after changing the frequency to stabilize the circuit action.

This type of conventional PLL frequency synthesizer is disclosed in Japanese patent laid-open application No. Hei 4-192625. As shown by blocks in FIG. 5, the conventional PLL frequency synthesizer includes a voltage-controlled oscillator (VCO) 1 the oscillation frequency of which is controlled by a control voltage Vc so as to output an oscillation signal fo; a variable frequency-divider 2 for dividing the signal fo to output a frequency-divided signal fv; a reference signal generator 3 for generating a reference signal fr indicative of a reference frequency; a frequency-phase comparator 4 for comparing phases between the frequency-divided signal fv and the reference signal fr to output an up or down signal for use as a phase error signal determined through the phase comparison; a charge pump 10 for producing a DC charge pump signal cp in response to input of the up or down signal; and a loop filter 6 for smoothing the signal cp to generate the control voltage Vc. A basic PLL synthesizer is formed by a feedback loop consisting of the blocks 1, 2, 3, 4, 10 and 6. The PLL frequency synthesizer further includes a current-flow control circuit 11 for controlling the amount of charge/discharge current flow of the charge pump 10.

Referring to FIG. 5, operation of the conventional PLL frequency synthesizer will next be described. The VCO 1 is supplied with a control signal Vc to produce an oscillation signal fo having an oscillation frequency that corresponds to the supplied control signal Vc. The variable frequency-divider 2 is supplied with the oscillation signal fo to produce a frequency-divided signal fv, while the reference signal generator 3 generates a reference signal fr. The frequency-phase comparator 4 is supplied with the frequency-divided signal fv and the reference signal fr to compare frequency phases between both signals. The frequency-phase comparator 4 outputs a corresponding error signal, up signal or down signal, as a result of the comparison. The charge pump 10 supplies a charge pump signal cp to the loop filter 6 in response to input of the error signal. In other words, the charge pump 10 supplies the loop filter 6 with a charge output when the up signal is active or a discharge output when the down signal is active. The loop filter 6 integrates and smooth the received charge pump signal cp to produce the control signal Vc. The output of the loop filter 6, i.e., the control signal Vc is fed back to the VCO 1, thus forming the PLL.

When changing frequency, the current-flow control circuit 11 increases the amount of charge/discharge current flow of the charge pump 10 to raise the loop gain, so that the pull-in time (lock-up time) is shortened. After changing the frequency, it reduces the output current of the charge pump 10 so as to secure a stable circuit action.

However, the current-flow control circuit 11 in the conventional PLL frequency synthesizer merely has a terminal for setting the amount of current flow. When changing frequency, the current-flow control circuit 11 supplies a set value of current flow to the charge pump 10 in response to the change in divided frequency of the variable frequency-divider 2 so as to increase a fixed amount of charge/discharge current flow. The current-flow control circuit 11 then controls the charge pump 10 to reduce the amount of charge/discharge current flow continuously with time. In other words, the current-flow control circuit 11 merely serves to increase a fixed amount of charge/discharge current flow, irrespective of the input value of the frequency changing data, leaving the PLL state out of consideration.

Referring to FIG. 6, there is shown a transient state during frequency changing operation. In FIG. 6, when the set frequency is shifted at time t1 to a frequency such as an adjacent channel with a relatively low rate of change in frequency, the increase of the fixed amount of charge/discharge current flow makes the loop gain too high and hence the output of the charge pump 10 higher than required. As a result, the oscillation frequency shifts to an overshoot state (curve Sb) and settles then.

The larger the amount of set current flow, i.e., the more the loop gain is so raised that the lock-up action is speeded up, the larger the overshoot will be. Such a phenomenon appears remarkably when changing frequency with a lower rate of change. In this case, after shifting to the overshoot state, the PLL may be settled from a frequency that is out of phase more than required, resulting in a long lock-up time.

As described above, the conventional PLL frequency synthesizer increases a fixed amount of charge/discharge current flow irrespective of the rate of change in frequency. When changing frequency, a low rate of change causes an excessive rise of the loop gain to make the oscillation frequency overshot excessively, and therefore, a problem arises that the PLL takes a long lock-up time.

SUMMARY OF THE INVENTION

A PLL frequency synthesizer according to the present invention includes a voltage-controlled oscillator for producing an oscillation signal having a frequency controlled by the value of a control voltage, a variable frequency-divider for dividing the oscillation signal to produce a frequency-divided signal, a reference-signal generator for generating a reference signal indicative of a reference frequency, a frequency-phase comparator for comparing phases between the frequency-divided signal and the reference signal to output a phase error signal; a charge pump circuit for producing a charge pump signal of DC voltage in response to input of the phase error signal, the charge pump signal having polarity and level corresponding to those of the phase error signal; and a loop filter which smooth and integrates the charge pump signal for generation of the phase error signal, characterized in that a PLL state detecting circuit is provided for generating a gain control signal of DC voltage in response to input of said phase error signal, the gain control signal being proportional to the level of this phase error signal, and a gain control circuit is provided in said charge pump circuit for linearly changing the voltage of said charge pump signal under control of said gain control signal.

As described above, the PLL frequency synthesizer according to the present invention includes the PLL state detecting circuit and the variable gain type charge pump, in which the gain of the charge pump is controlled optimally and automatically according to the PLL state. When changing frequency, a high rate of change in frequency increases the gain of the charge pump to reduce the lock-up time of the PLL. Meanwhile, a low rate of change in frequency reduces the gain of the charge pump to suppress such an excessive overshoot that it may occur in the conventional, thereby achieving high-speed lock-up time according to the operating state of the PLL.

BRIEF DESCRIPTION OF THE DRAWINGS

The above and other objects, advantages and feature of the present invention will be more apparent from the following description taken in conjunction with the accompanying drawings, in which.

DETAILED DESCRIPTION OF THE PREFERRED EMBODIMENTS

Figure 1:
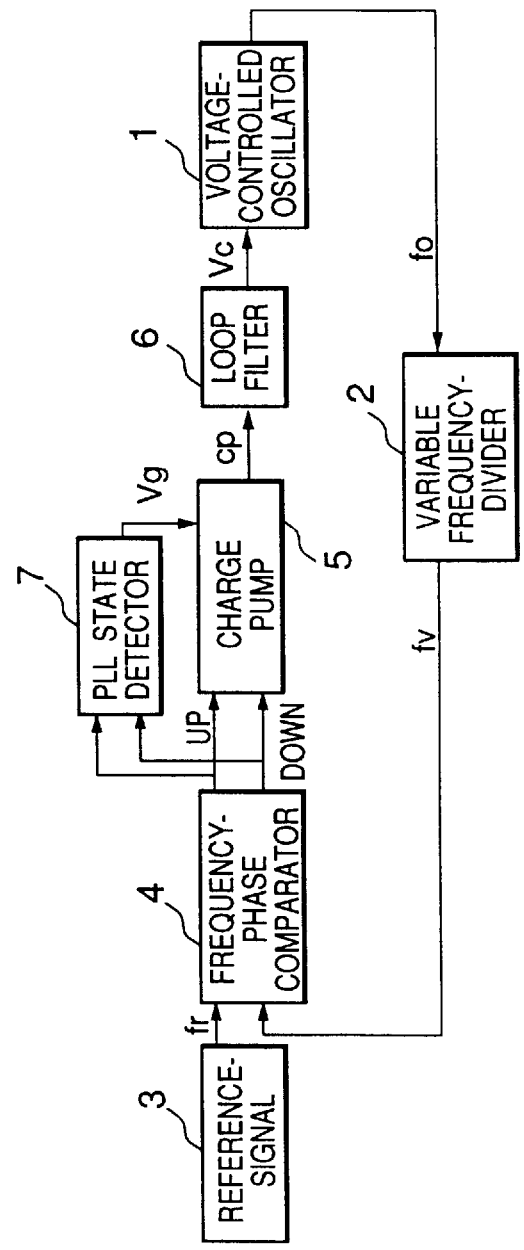
FIG. 1 is a block diagram showing a PLL frequency synthesizer according to an embodiment of the present invention.
Figure 5:
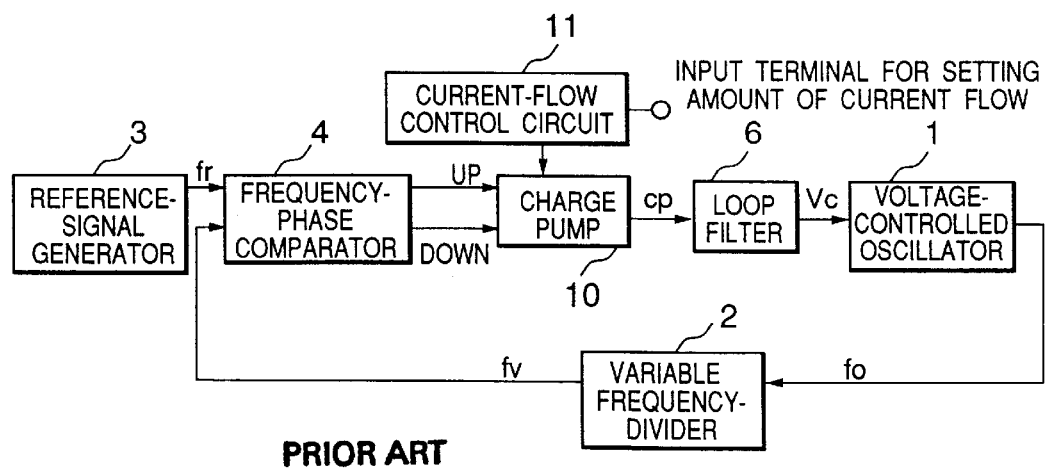
FIG. 5 is a block diagram showing a conventional PLL frequency synthesizer.
Figure 6:
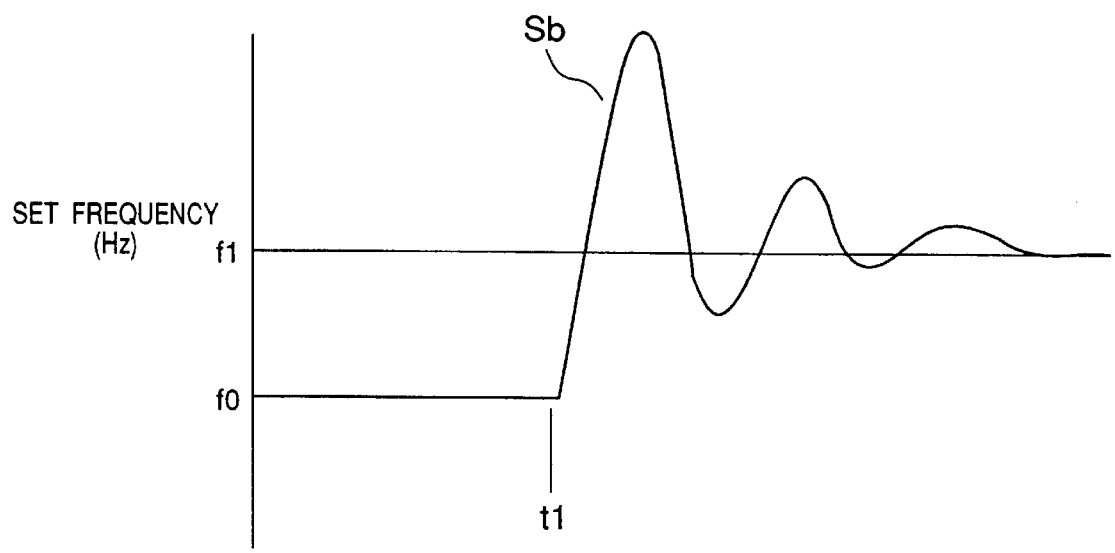
FIG. 6 is a waveform chart showing an operation of the conventional PLL frequency synthesizer.

Referring now to a block diagram of FIG. 1, in which blocks common to those of FIG. 5 are given the same reference numerals, there is shown an embodiment of a PLL frequency synthesizer according to the present invention. In the PLL frequency synthesizer of FIG. 1, the voltage-controlled oscillator (VCO) 1, the variable frequency-divider 2, the reference signal generator 3, the frequency-phase comparator 4, and the loop filter 6 are common to those in the conventional. The PLL frequency synthesizer according to the embodiment is characterized by a variable gain type charge pump 5, which is used instead of the charge pump 10, for producing a charge pump signal cp in response to input of the up or down signal, with the amount of charge/discharge current flow of the charge pump signal cp controlled by a gain control signal Vg; and a PLL state detector 7 which supplies the charge pump 5 with the gain control signal Vg for gain setting in response to the input of the up or down signal.

Operation of the embodiment will next be described with reference to FIG. 1. The normal processing steps in the PLL operation from producing the oscillation signal to in the VCO 1 until producing the control voltage Vc in the loop filter 6 are the same as those in the conventional, and therefore, all descriptions thereof are omitted except portions related to the present invention.

According to the present invention, the PLL state detector 7 receives an up or down signal from the frequency-phase comparator 4 to output a gain control signal Vg for gain setting of the charge pump 5. As similar to the conventional, the charge pump 5 supplies the loop filter 6 with a charge pump signal cp in response to input of the up or down error signal, i.e., it supplies charge current when the up signal is active or discharge current when the down signal is active. At this time, the amount of charge/discharge current flow is determined by the control signal Vg.

Figure 2:
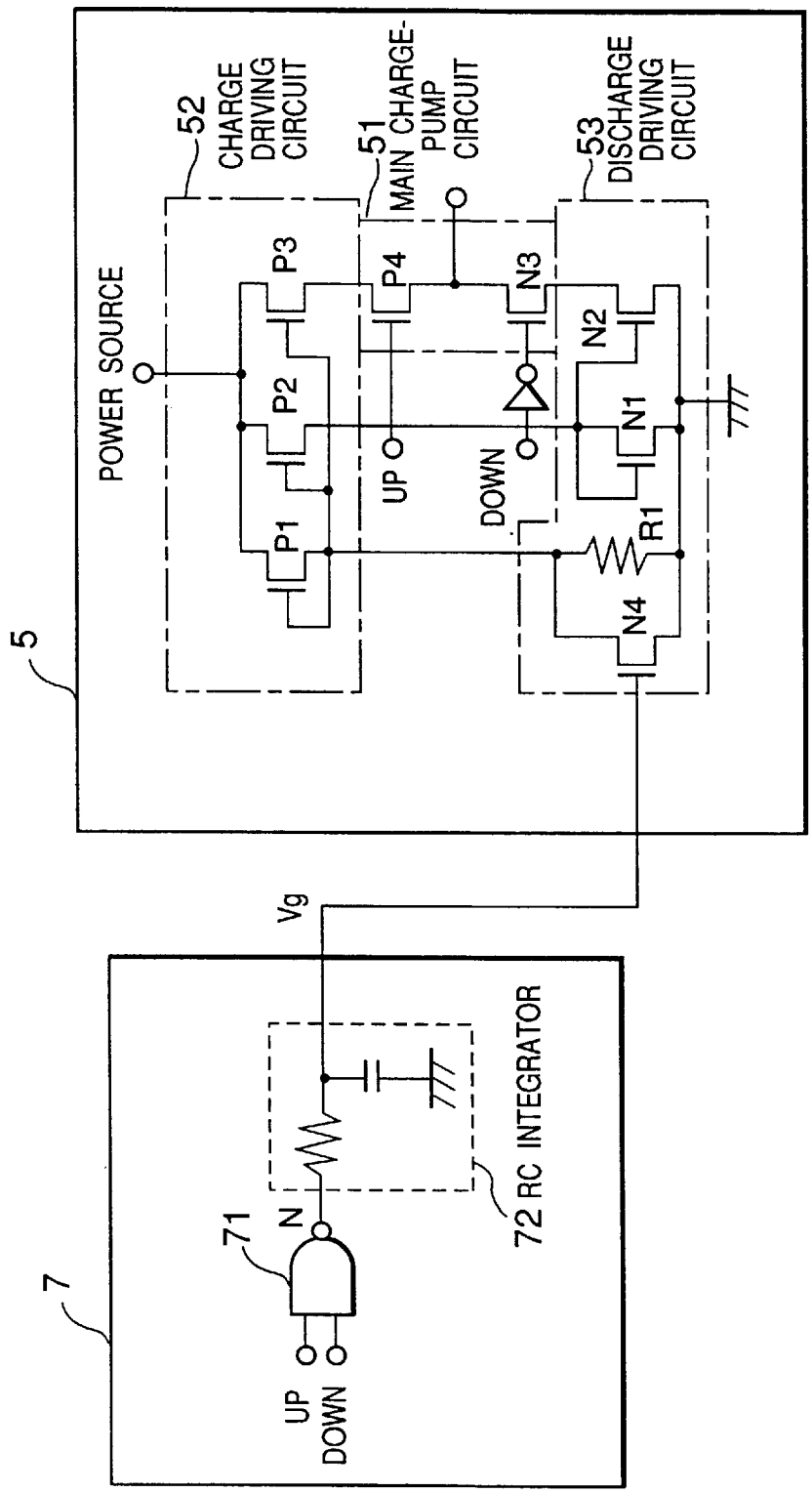
FIG. 2 is a circuit diagram showing a PLL state detector and a charge pump circuit as shown in FIG. 1.

FIG. 2 is a circuit diagram showing circuit structures of the PLL state detector 7 and the charge pump 5. As shown in FIG. 2, the PLL state detector 7 includes a two-input NAND gate 71 for receiving two inputs of up and down signals to output a NAND signal N, and an RC integrator 72 for integrating the NAND signal N to generate the signal Vg.

Figure 3:
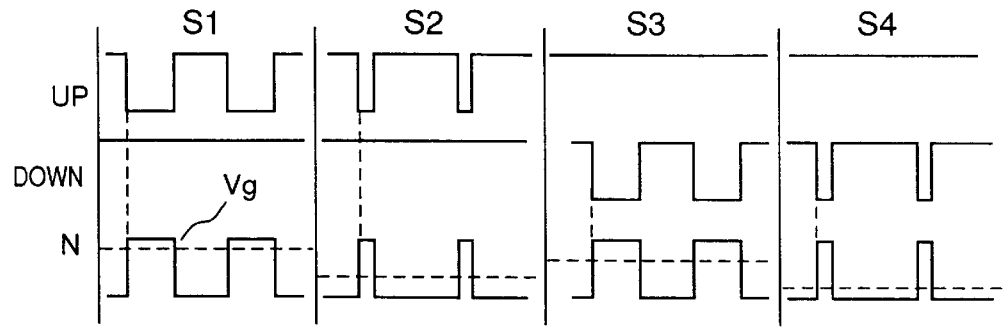
FIG. 3 is a timing chart showing an operation of the PLL frequency synthesizer according to the embodiment.

Referring to a timing chart of FIG. 3, which schematically describes the operation of the PLL state detector 7, each pulse width of the up and down error signals is proportional to the amount of phase error determined through the phase comparison by the frequency-phase comparator 4. The NAND gate 71 outputs the NAND signal N having a pulse width that corresponds to the amount of phase error signal irrespective of which error signal, up or down, is active. The RC integrator 72 integrates the NAND signal N to supply the charge pump 5 with a DC voltage corresponding to the integral value for use as the gain control signal Vg.

When the set frequency is shifted to a frequency such as an adjacent channel with a low rate of change in frequency, since the pulse width of the NAND signal N is small (state S2 or S4), the integrator 72 produces a gain control signal Vg of low DC voltage. When the rate of change in frequency is high, since the pulse width of the NAND signal N is large (state S1 or S3), the integrator 72 produces a gain control signal Vg of high DC voltage.

Returning to FIG. 2, the variable gain type charge pump 5 according to the embodiment includes a main charge-pump circuit 51 for supplying charge/discharge current to an output terminal Tcp in response to input of the up or down signal, a charge driving circuit 52 for supplying charge current to the main charge-pump circuit 51, and a discharge driving circuit 53 for supplying discharge current to the main charge-pump circuit 51.

The main charge-pump circuit 51 includes a P channel type MOS transistor P4 with the gate supplied with the up signal and the drain connected to the output terminal Tcp; and an N channel type MOS transistor N3 with the gate supplied with an inverted signal of the down signal and the drain connected to the output terminal Tcp.

The charge driving circuit 52 includes a P channel type MOS transistor P1, in which the source is connected to a power source, and the gate and the drain are commonly connected to one end of a resistor R1 with the other end of the resistor R1 grounded; a P channel type MOS transistor P2 with the source connected to the power source and the gate connected to the gate of the transistor P1; and a P channel type MOS transistor P3 with the source connected to the power source, the gate connected to the gate of the transistor P2, and the drain connected to the source of the transistor P4. These transistors P1, P2 and P3 constitute a current-mirror circuit.

The discharge driving circuit 53 includes an N channel type MOS transistor N4, in which the gate is supplied with the gain control signal Vg, the source is grounded, and the drain is connected to the one end of the resistor R1; an N channel type MOS transistor N1 with the drain and the gate commonly connected to the drain of the transistor P2 and the source connected to the ground; and an N channel type MOS transistor N2 with the gate connected to the gate of the transistor N1, the source connected to the ground, and the drain connected to the source of the transistor N3. The transistors N1 and N2 constitute a current-mirror circuit. As a result, the transistor N2 and the transistor P3 has same current driving ability.

The operation will next be described. The transistor P3 in the charge driving circuit 52 serves as a charge-current source. When the up signal becomes active, the transistor P4 conducts to supply the charge-pump output terminal Tcp with charge current for use as the charge pump signal cp. The transistor N2 in the discharge driving circuit 53 serves as a discharge-current source. When the down signal becomes active, the transistor N3 conducts to supply the charge-pump output terminal Tcp with discharge current for use as the charge pump signal cp.

The charge/discharge current to be output from the charge driving circuit 52 or discharge driving circuit 53 is determined by the resistor R1 and the transistor N4 connected in parallel with the resistor R1. In other words, the amount of current flow induced in the charge pump 5 is controlled by the gain control voltage Vg input to the gate of the transistor N4. A high gain control voltage Vg causes an increased amount of current flow, whereas a low gain control voltage Vg causes a reduced amount of current flow. It is therefore possible to automatically control the charge pump 5 so as to increase the gain of the charge pump 5 when the rate of change in frequency is high or reduce it when the rate of change in frequency is low.

Figure 4:
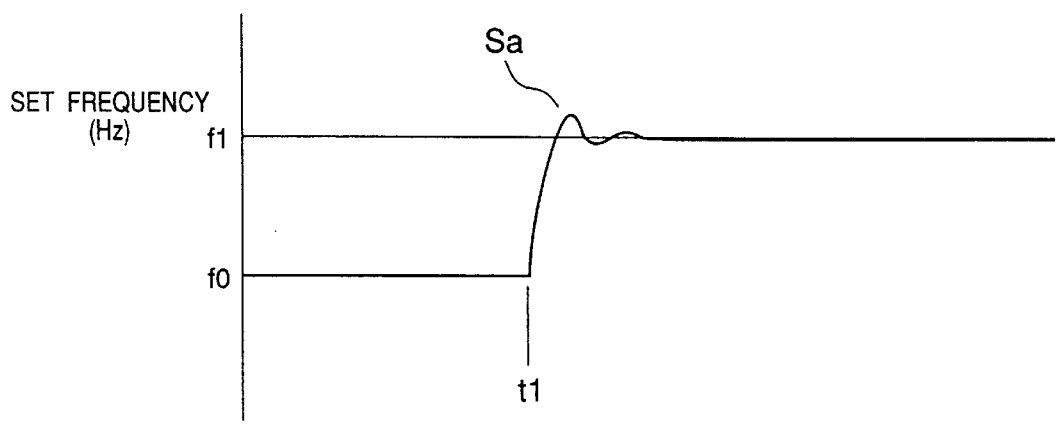
FIG. 4 is a waveform chart showing operation of the PLL frequency synthesizer according to the embodiment.

A high rate of change in frequency increases the gain of the charge pump 5 to reduce the lock-up time of the PLL. Meanwhile, a low rate of change in frequency reduces the gain of the charge pump 5 to suppress occurrence of an excessive overshoot, as shown by the curve Sa in FIG. 4, so that an excessive change in frequency can be prevented, thereby achieving quick lock-up time according to the operating state of the PLL.

Although the invention has been described with reference specific embodiment, the description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

I claim:

1. A phase-locked-loop (PLL) frequency synthesizer comprising:
    a voltage-controlled oscillator for producing an oscillation signal having a frequency controlled by a value of a control voltage;
    a variable frequency-divider for dividing the oscillation signal to produce a frequency-divided signal;
    a reference-signal generator for generating a reference signal indicative of a reference frequency;
    a frequency-phase comparator for comparing phases between the frequency-divided signal and the reference signal to output a first phase error signal and a second phase error signal;
    a charge pump circuit for producing a charge pump signal of DC voltage in response to input of the first phase error signal and the second phase error signal, the charge pump signal having polarity and level corresponding to the first phase error signal and the second phase error signal;
    a loop filter which smooths and integrates the charge pump signal for generation of the control voltage;
    a PLL state detecting circuit for generating a gain control signal of DC voltage in response to input of said first phase error signal and said second phase error signal, the gain control signal being proportional to the levels of said first phase error signal and said second phase error signal; and
    a gain control circuit provided in said charge pump circuit for linearly changing the voltage of said charge pump signal under control of said gain control signal,
    said charge-pump circuit comprising:
        a main charge-pump circuit comprising a first MOS transistor of a first conductive type with the gate supplied with said first phase error signal and the drain connected to an output terminal; and a second MOS transistor of a second conductive type with the gate supplied with an inverted signal of said second phase error signal and the drain connected to the output terminal;
        a charge driving circuit comprising a third MOS transistor of the first conductive type, in which the source is connected to a power source, and the gate and the drain are commonly connected to one end of a resistor with the other end of the resistor grounded; a fourth MOS transistor of the first conductive type with the source connected to the power source and the gate connected to the gate of said third MOS transistor; and a fifth MOS transistor of the first conductive type with the source connected to the power source, the gate connected to the gate of said fourth MOS transistor, and the drain connected to the source of said first MOS transistor; and
        a discharge driving circuit comprising a sixth MOS transistor of the second conductive type, in which the gate is supplied with said gain control signal, the source is grounded, and the drain is connected to the one end of said resistor; a seventh MOS transistor of the second conductive type with the drain and the gate commonly connected to the drain of said fourth MOS transistor and the source connected to the ground; and an eighth MOS transistor of the second conductive type with the gate connected to the gate of said seventh MOS transistor, the source connected to the ground, and the drain connected to the source of said second MOS transistor.

2. A phase-locked-loop (PLL) circuit comprising:
    a voltage control oscillator producing a first oscillation signal controllable in frequency by a control signal;
    a frequency divider for frequency-dividing said oscillation signal to produce a second oscillation signal;
    a phase comparator coupled to receive a reference signal and said second oscillation signal to produce an error signal indicative of a difference in phase between said reference signal and said second oscillation signal;
    a variable current source;
    a detector responding to said error signal and controlling a current flowing through said variable current source;
    a first current mirror circuit having an input node for receiving said current, and first output node; and
    a charge-pump circuit coupled to said first output node of said first current mirror circuit and producing said control signal in response to said error signal.

3. The PLL circuit as claimed in claim 2, wherein said first current mirror circuit further has a second output node, and said PLL circuit further comprises:
    a second current mirror circuit having an input node coupled to said second output node of said first current mirror circuit and having a third output node, said charge-pump circuit being coupled between said first output node of said first current mirror circuit and said third output node of said second current mirror circuit.

4. The circuit as claimed in claim 3, wherein said error signal includes a first error signal indicating that said reference signal is advanced in phase as compared to said second oscillation signal and a second error signal indicating that said second oscillation signal advanced in phase as compared to said reference signal, and said charge-pump circuit includes first and second transistors coupled in series between said first output node and said third output node, said first transistor being controlled by said first error signal, and said second transistor being controlled by said second error signal.

* * * * *